United States Patent [19]

Tamaki et al.

[11] Patent Number: 5,337,465
[45] Date of Patent: Aug. 16, 1994

[54] CHIP PART HANDLING APPARATUS

[75] Inventors: Kuniaki Tamaki; Shigenori Kobayashi, both of Kyoto, Japan

[73] Assignee: Murata Manufacturing Co., Ltd., Japan

[21] Appl. No.: 945,136

[22] Filed: Sep. 15, 1992

[30] Foreign Application Priority Data

Sep. 18, 1991 [JP] Japan .................. 3-237742

[51] Int. Cl.⁵ ............................................. H05K 3/30
[52] U.S. Cl. .................................... 29/740; 29/741; 29/743; 29/759; 414/224
[58] Field of Search ............... 29/740, 741, 743, 759, 29/DIG. 44; 198/345, 385, 390, 463.6; 414/224, 737

[56] References Cited

U.S. PATENT DOCUMENTS

| | | | |
|---|---|---|---|
| 3,724,068 | 4/1973 | Galli | 29/740 X |
| 4,395,184 | 7/1983 | Braden | 29/759 X |
| 4,459,743 | 7/1984 | Watanabe et al. | 29/759 X |
| 4,733,459 | 3/1988 | Tateno | 29/741 |
| 4,817,273 | 4/1989 | Lape et al. | 29/743 X |
| 4,995,157 | 2/1991 | Hall | 29/740 |

*Primary Examiner*—Peter Dungba Vo
*Attorney, Agent, or Firm*—Ostrolenk, Faber, Gerb & Soffen

[57] ABSTRACT

First and second aligning portions each having a plurality of parallel downwardly sloped grooves, are inclinedly arranged to communicate with a chip box containing a plurality of chip parts at random. The chip box and the first aligning portion are supplied with vibration, to serially align the chip parts in the grooves of the first aligning portion. The chip parts are then received in the grooves of the second aligning portion. The first of the chip parts thus received in the second aligning portion are received in a plurality of receiving cavities provided in a separable portion respectively, so that the chip parts received in the receiving cavities are simultaneously discharged by a suction chuck.

13 Claims, 6 Drawing Sheets

CHIP PART HANDLING APPARATUS

BACKGROUND OF THE INVENTION

1. Field of the Invention

The present invention relates to a chip part handling apparatus which is employed for aligning a plurality of directional chip parts along a prescribed direction and thereafter discharging the same. This handling apparatus can be advantageously adapted to handle chip-type electronic components, for example, for aligning the same along a prescribed direction.

2. Description of the Background Art

A typical example of a chip part handling apparatus is a parts feeder, which comprises a hopper for containing chip parts, and a spiral supply track extending from the hopper. The supply track can feed a plurality of chip parts which are aligned along a prescribed direction. In such a feeder, however, the plurality of chip parts are linearly aligned with each other in the supply track. Therefore, it is impossible to simultaneously discharge the plurality of chip parts which are aligned with each other.

U.S. Pat. No. 4,395,184 discloses another type of a chip part handling apparatus, which comprises a holding plate having a plurality of holes for receiving a plurality of chip parts one by one therein. According to this apparatus, a plurality of chip parts are supplied from a hopper, to be received in the holes provided in the holding plate along a prescribed direction. This apparatus can simultaneously handle a plurality of chip parts with the holding plate. However, it takes relatively much time to insert the chip parts in the holes of the holding plate along a prescribed direction, while it is relatively troublesome to handle such a plurality of chip parts with the holding plate.

SUMMARY OF THE INVENTION

Accordingly, an object of the present invention is to provide a chip part handling apparatus, which can simultaneously discharge a plurality of chip parts being aligned along a prescribed direction.

The present invention is directed to a chip part handling apparatus which is employed for aligning a plurality of directional chip parts along a prescribed direction and discharging the same. The inventive handling apparatus comprises a chip box for containing a plurality of chip parts at random, and an aligning portion which is subsequent to the chip box. The aligning portion is provided with a plurality of parallel downwardly sloped grooves, each having a sectional form enabling serial alignment of a plurality of chip parts, as well as an inclination angle enabling downward sliding of the chip parts. A separable portion is provided subsequently to the aligning portion. This separable portion has a plurality of receiving cavities which communicate with downstream ends of the downwardly sloped grooves respectively, so that each receiving cavity receives the first one of a plurality of chip parts being downwardly slid in each downwardly sloped groove. The chip parts thus received in the receiving cavities are discharged by a discharge portion.

In the inventive chip part handling apparatus, a plurality of directional chip parts which are contained in the chip box at random are introduced into the downwardly sloped grooves provided in the aligning portion along a prescribed direction, to be downwardly slid in the grooves serially along the prescribed direction. The chip parts slid in the grooves are successively received in the receiving cavities provided in the separable portion separated from the first ones in the respective downwardly sloped grooves. Thus, the chip parts are received one by one in the receiving cavities provided in the separable portion, to be simultaneously discharged in the discharge portion along the direction provided in the grooves.

According to the inventive chip part handling apparatus, therefore, it is possible to simultaneously discharge a plurality of chip parts which are aligned along a prescribed direction, whereby efficiency for handling the chip parts can be improved, while it is possible to further improve efficiency in a next chip part handling step for measuring electric characteristics of the chip parts or packaging the same, for example.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
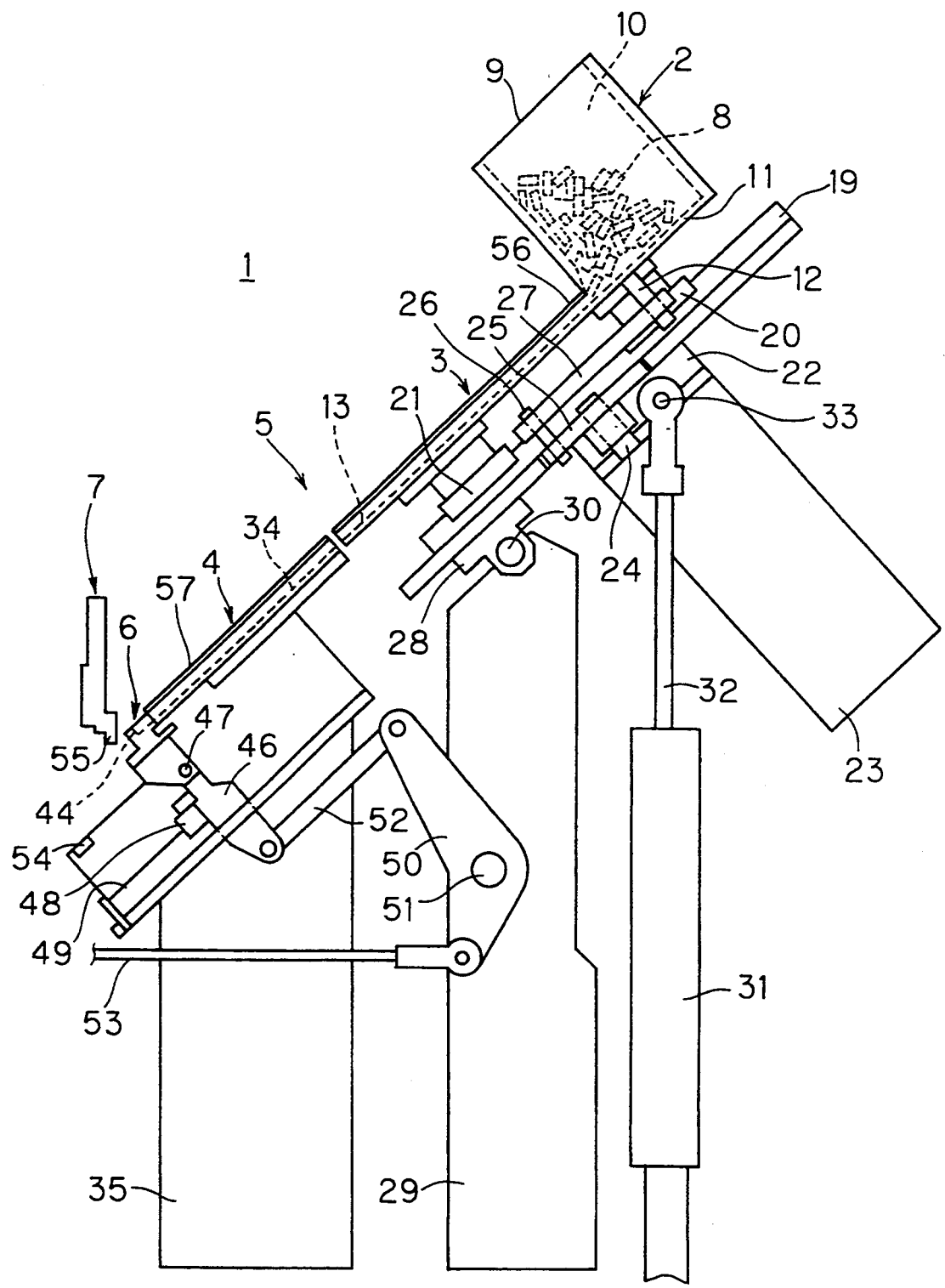
FIG. 1 is a side elevational view showing a chip part handling apparatus according to an embodiment of the present invention.

Referring mainly to FIG. 1, a chip part handling apparatus 1 according to an embodiment of the present invention generally comprises a chip box 2, an aligning portion 5 including first and second aligning portions 3 and 4, a separable portion 6, and a discharge portion 7. According to handling apparatus 1, a plurality of directional chip parts 8, which are in the form of rectangular parallelopipeds, for example, are contained in the chip box 2 at random to be aligned along a prescribed direction in the aligning portion 5, so that first ones the aligned chip parts 8 are separated from the remaining ones in the separable portion 6 and the chip parts 8 are discharged from the discharge portion 7 while maintaining the aligned states.

As shown in FIGS. 1, 2, 4 and 5, the chip box 2 has an opening 9 in its upper surface, to define a space 10 for containing the plurality of chip parts 8. The chip box 2 is further provided with a downwardly projecting fixed shaft 12 on the lower surface of its bottom wall 11.

The chip box 2 is integrated with the first aligning portion 3, which is in the form of a chute having the same width as the chip box 2. The first aligning portion 3 has a plurality of parallel downwardly sloped grooves 13 communicating with the space 10 of the chip box 2. Each of the grooves 13 has a sectional form enabling serial alignment of a plurality of chip parts 8, and is capable of providing an inclination angle enabling downward sliding of the chip parts 8 by gravity.

Figure 5:
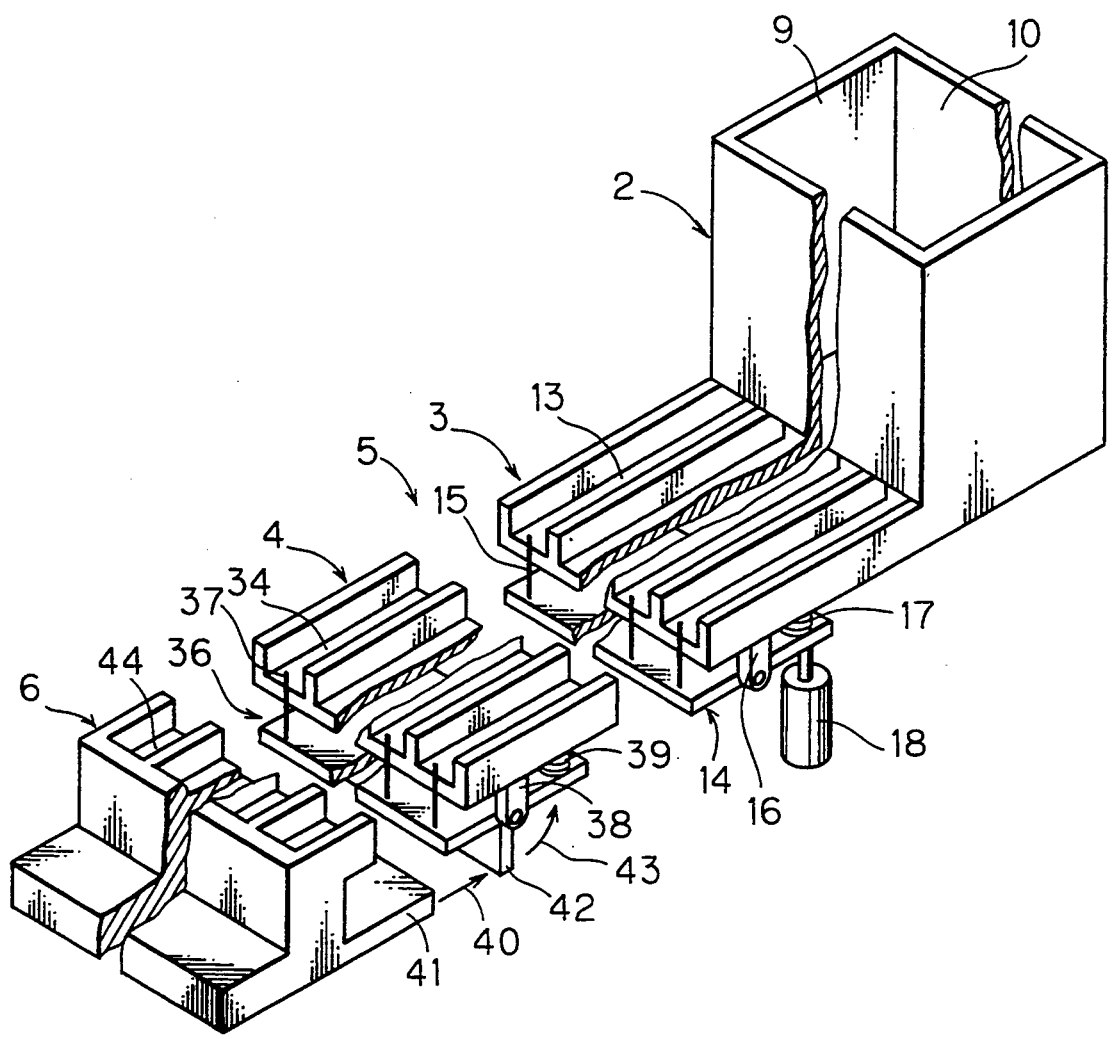
FIG. 5 is a perspective view illustrating the chip box, an aligning portion and the separable portion of the handling apparatus according to the embodiment of the present invention.
Figure 6:
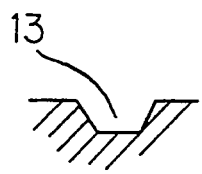
FIGS. 6 to 10 are sectional views showing various modifications of downslope grooves provided in the aligning portion.
Figure 7:
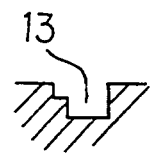
Figure 8:
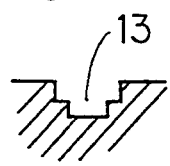
Figure 9:
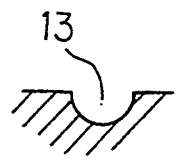
Figure 10:
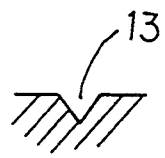

As shown in FIG. 5, downstream ends of the grooves 13 are selectively closed by a stopper 14, which includes a plurality of narrow pins 15 being arranged in relation to the grooves 13 respectively. This stopper 14 is rockably supported by a bracket 16 which is provided on the lower surface of the first aligning portion 3. A compression spring 17 is arranged between the stopper 14 and the first aligning portion 3, for urging and rocking the stopper 14 so that the pins 15 close the downstream ends of the grooves 13. On the other hand, an air cylinder 18 is provided to open the downstream ends of the grooves 13 against elasticity of the compression spring 17.

A guide rail 19 is arranged under the chip box 2 and the first aligning portion 3. Further, sliders 20 and 21 are provided on the lower surfaces of the bottom wall 11 of the chip box 2 and the first aligning portion 3 respectively, to slidably engage with the guide rail 19.

A motor 23 is provided on the lower surface of the guide rail 19 through a bracket 22, while a crank disc 25 is fixed to a motor shaft 24 of the motor 23. An eccentric pin 26 is provided on an eccentric position of the crank disc 25, so that a connecting rod 27 is coupled between the eccentric pin 26 and the aforementioned fixed shaft 12. When the motor shaft 24 is rotated, therefore, the chip box 2 and the first aligning portion 3 are linearly reciprocated in the longitudinal direction of the guide rail 19 on the basis of a slider crank mechanism including the guide rail 19, the sliders 20 and 21, the crank disc 25, the eccentric pin 26, the connecting rod 27 and the fixed shaft 12. The chip parts 8 contained in the chip box 2 are stirred by such reciprocation.

It is possible to integrally change the inclination angles of the chip box 2 and the first aligning portion 3. The guide rail 19 is provided on its lower surface with a bracket 28, which is coupled to a stud 29 through a rotative pin 30. An end of a piston rod 32 of an actuator 31 which is formed by an air cylinder, for example, is coupled to the bracket 22 through another rotative pin 33. When the actuator 31 is driven, therefore, the structure including the chip box 2 and the first aligning portion 3 changes the inclination angles about the rotative pin 30, to be brought into the state shown in FIG. 2 or 4 from that shown in FIG. 1.

The second aligning portion 4 is located on the downstream side of the first aligning portion 3. This second aligning portion includes downwardly sloped grooves 34, which are aligned with the grooves 13 of the first aligning portion 3. Grooves 34 are identical in sectional form to the grooves 13. The second aligning portion 4 is fixed onto a stud 35 to incline the grooves 34 at angles enabling downward sliding of the chip parts 8. The second aligning portion 4 is preferably smaller in length than the first aligning portion 3.

As shown in FIG. 5, downstream ends of the downwardly sloped grooves 34 provided in the second aligning portion 4 are selectively closed by a stopper 36, which includes pins 37 arranged in relation to the grooves 34 respectively. Stopper 36 is rockably supported by a bracket 38, which is mounted on the lower surface of the second aligning portion 4. A compression spring 39 is arranged between the lower surface of the second aligning portion 4 and the stopper 36, to urge and rock the stopper 36, so that the pins 37 close the downstream ends of the grooves 34. When the separable portion 6 approaches the second aligning portion 4 as shown by arrow 40 in FIG. 5, contact portion 41 presses a blade 42 which is provided in the stopper 36, thereby rotating the stopper 36 along arrow 43 against elasticity of the compression spring 39. Consequently, the pins 37 are retracted from the downstream ends of the grooves 34.

The separable portion 6 has a plurality of receiving cavities 44 communicating with the downstream ends of the grooves 34, respectively. Each receiving cavity 44 is so sized as to receive the first one of a plurality of chip parts 8 which are downwardly slid in each of grooves 34.

The separable portion 6 is approachable to and separable from the second aligning portion 4. To this end, the separable portion 6 is rotatably mounted on a movable carriage 46, having a slider 48, through a pin 47. An inclined guide rail 49 is mounted on the stud 35, so that the slider 48 slidably engages with the guide rail 49. Thus, the carriage 46 is movable in the longitudinal direction of the guide rail 49. A lever 50 is mounted on the aforementioned stud 29, to be rotatable about a pin 51. An end of lever 50 is coupled to the carriage 46 through a connecting rod 52, while the other end of the lever 50 is coupled with a driving rod 53 which is driven by a driving source (not shown) for reciprocation. When the driving rod 53 is driven to rotate the lever 50, therefore, the carriage 46 is linearly reciprocated through the connecting rod 52. Thus, the separable portion 6 is approachable to and separable from the second aligning portion 4.

Figure 3:
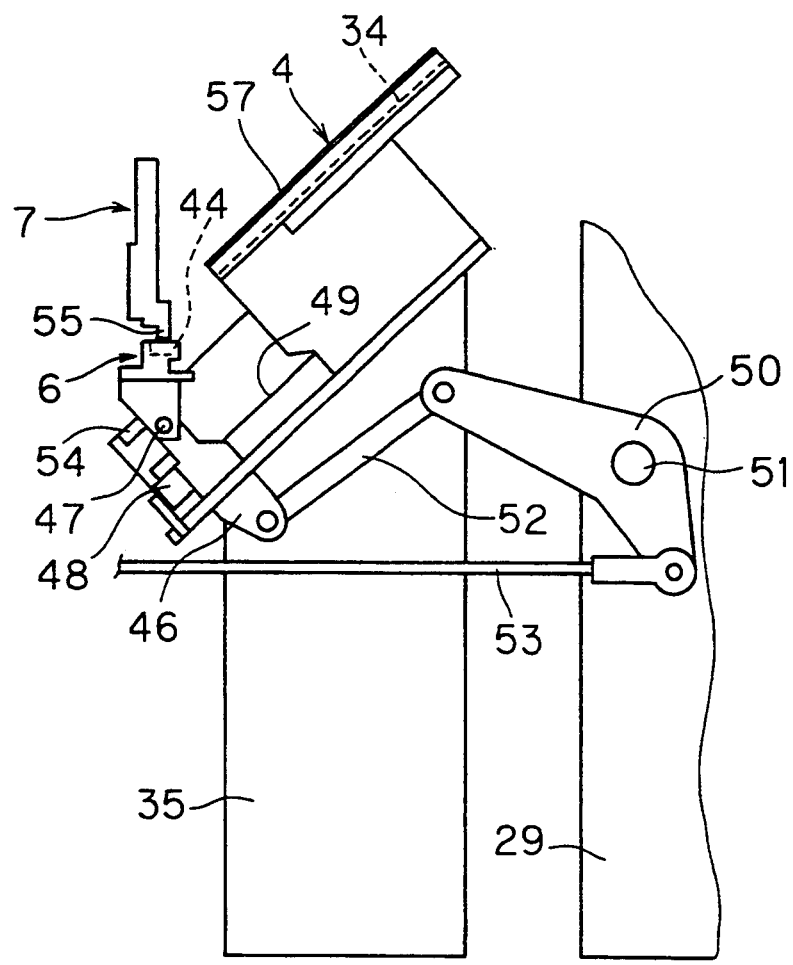
FIG. 3 is a side elevational view showing a second aligning portion, a separable portion and a discharge portion of the handling apparatus according to the embodiment of the present invention in another state which is different from that shown in FIG. 1.

As hereinabove described, the separable portion 6, which is mounted on the carriage 46 through the pin 47, is rotatable about the pin 47. Unless external force is applied, however, the separable portion 6 is maintained in a state being aligned with the carriage 46, as shown in FIG. 1. When the separable portion 6 is separated from the second aligning portion 4 following movement of the carriage 46 as shown in FIG. 3, on the other hand, a contact block 54 which is fixedly provided above the guide rail 49 comes into contact with the separable portion 6, to force the same into an upright state.

The aforementioned discharge portion 7 is located above the separable portion 6, which is forced into the upright state as described above. The discharge portion 7 comprises a suction chuck 55, which holds the chip parts 8 by suction based on a vacuum, for example. The suction chuck 55 simultaneously discharges the plurality of chip parts 8 which are received by the plurality of receiving cavities 44 provided in the separable part 6. This suction chuck 55 is so movable as to transfer the plurality of chip parts 8 to another position. When the handling apparatus 1 is employed for aligning a plurality of chip parts which are subjected to measurement of electric characteristics, the plurality of chip parts 8 are transferred to a prescribed position of a characteristic measuring apparatus (not shown) by the suction chuck 55. On the other hand, the plurality of chip parts 8 may be packaged by taping, for example. In this case, a tape having cavities for receiving the chip parts one by one therein is employed. When the handling apparatus 1 is employed for aligning chip parts to be received in such cavities of the tape, the chip parts 8 held by the suction chuck 55 are transferred to be inserted in the cavities of the tape.

The upper surfaces of the downwardly sloped grooves 13 and 34 provided in the first and second aligning portions 3 and 4 are covered with lids 56 and 57, whereby the chip parts 8 are prevented from jumping out.

The operation of the handling apparatus 1 is now described.

Figure 2:
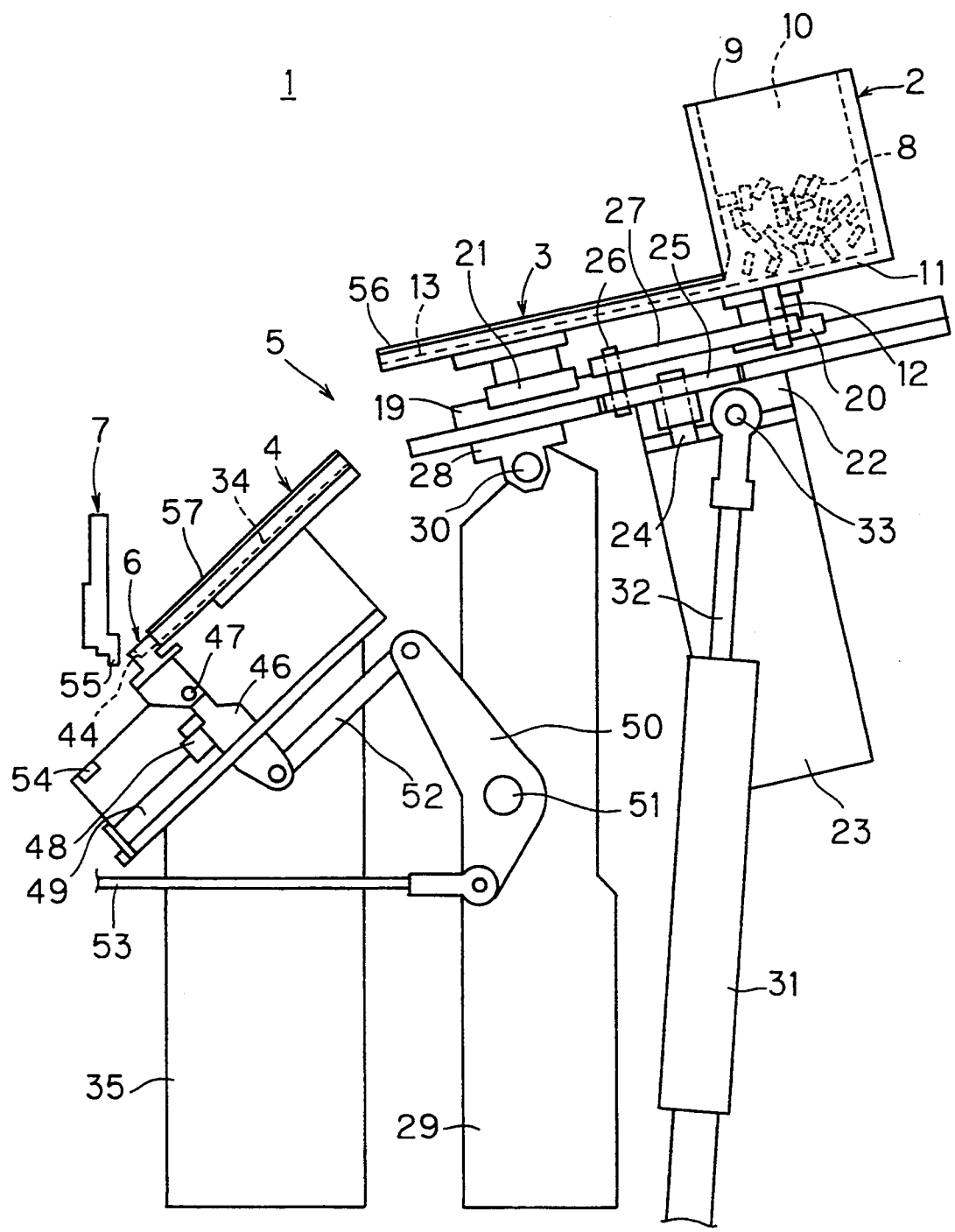
FIG. 2 is a side elevational view showing the handling apparatus according to the embodiment of the present invention in a state which is different from that shown in FIG. 1.

First, a plurality of chip parts 8 are introduced into the chip box 2, in the state shown in FIG. 2. At this time, the downstream ends of the grooves 13 are closed by the stopper 14. Then, the motor 23 is driven so as to vibrate, and i.e., linearly reciprocate the chip box 2 and the first aligning portion 3. At the same time, the piston rod 32 of the actuator 31 may also be reciprocated within a prescribed stroke for reciprocating the chip box 2 and the first aligning portion 3 about the rotative pin 30. The chip box 2 and the first aligning portion 3 are thus vibrated to stir the chip parts 8 contained in the chip box 2, so that some of the chip parts 8 thus directed in various directions are aligned with and introduced into the grooves 13. A plurality of chip parts 8 thus introduced into each of the grooves 13 are serially aligned with each other.

When the grooves 13 are completely or substantially filled up with the chip parts 8 in the aforementioned manner, the actuator 31 is driven so as to align the first and second aligning portions 3 and 4 with each other as shown in FIG. 1. Then, the air cylinder 18 (FIG. 5) is driven to retract the pins 15 of the stopper 14 from the downstream ends of the grooves 13. In response to this, the chip parts 8 are downwardly slid by gravity from the grooves 13 of the first aligning portion 3 into the grooves 34 of the second aligning portion 4. When the grooves 34 are filled up with the chip parts 8, the stopper 14 again closes the downstream ends of the grooves 13. The first aligning portion 3 is longer than the second aligning portion 4, as hereinabove described, whereby the grooves 13 of the first aligning portion 3 can store a larger number of chip parts 8 than the grooves 34 of the second aligning portion 4. Even if the grooves 13 of the first aligning portion 3 are not completely filled up with the chip parts 8, it is possible to completely fill up the grooves 34 of the second aligning portion 4 with the chip parts 8 which are downwardly slid from the grooves 13.

As hereinabove described, the first ones of the chip parts 8 filling up the grooves 34 are received in the receiving cavities 44 provided in the separable portion 6. Then, the separable portion 6 is separated from the second aligning portion 4 following movement of the carriage 46. At a terminating end of this separation, the separable portion 6 comes into contact with the contact block 54, to be forced into an upright state. In this state, the suction chuck 55 provided in the discharge portion 7 simultaneously discharges the plurality of chip parts 8 which are received in the plurality of receiving cavities 44. When the separable portion 6 is separated from the second aligning portion 4, the stopper 36 shown in FIG. 5 closes the downstream ends of the grooves 34, and maintains this state until the separable portion 6 approaches the second aligning portion 4 again. Thus, the states shown in FIGS. 1 and 3 are alternately repeated so that the first ones of the chip parts 8 stored in the grooves 34 are successively discharged by the suction chuck 55.

Figure 4:
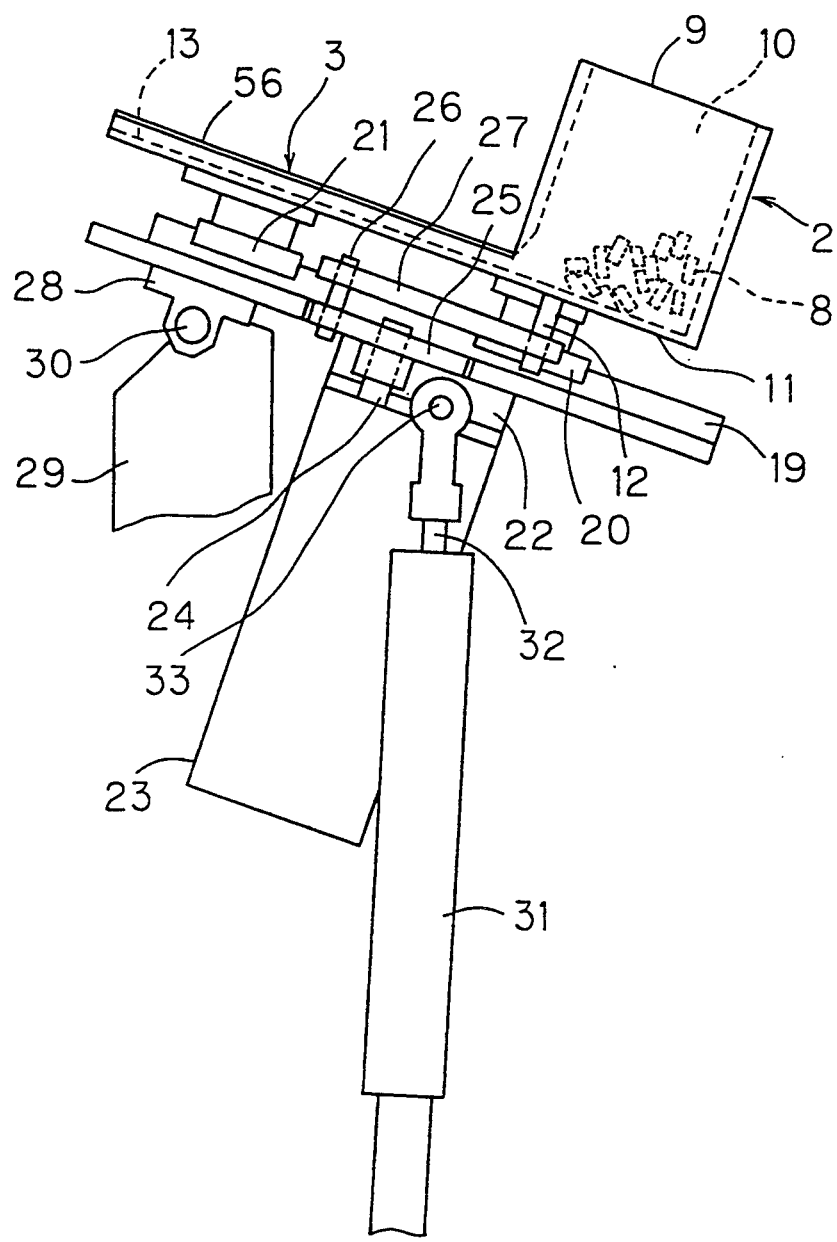
FIG. 4 is a side elevational view showing a chip box and a first aligning portion of the handling apparatus according to the embodiment of the present invention in still another state which is different from that shown in FIG. 1.

After the chip parts 8 are supplied from the first aligning portion 3 to the second aligning portion 4 as described above, the actuator 31 is driven to bring the chip box 2 and the first aligning portion 3 into the states shown in FIG. 4. Thus, the chip parts 8 remaining in the grooves 13 of the first aligning portion 3 are returned into the space 10 of the chip box 2. Then the actuator 31 is again driven to the state shown in FIG. 2, so that the aforementioned operation is repeated.

Although the aligning portion 5 comprises the first and second aligning portions 3 and 4 in the aforementioned embodiment, the second aligning portion 4 may be omitted so that the separable portion 6 is arranged on the downstream side of the first aligning portion 3.

The sectional forms of the downwardly sloped grooves 13 and 34 can be modified in response to the shapes of the chip parts 8 to be handled. FIGS. 6 to 10 illustrate modifications of the sectional forms of the grooves.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A chip part handling apparatus for aligning a plurality of chip parts along a prescribed direction and for discharging the plurality of chip parts, said apparatus comprising:

a chip box for containing said plurality of chip parts randomly;

an aligning portion including a first aligning portion and a second aligning portion, said second aligning portion being separate from and removably positioned downstream of said first aligning portion, said first and second aligning portions having a plurality of parallel downwardly sloped grooves, said grooves of said first aligning portion communicating with said chip box, each of said downwardly sloped grooves having a cross-section enabling serial alignment of said plurality of said chip parts, as well as an inclination angle enabling downward sliding of said plurality of chip parts;

a first stopper positioned between said first and second aligning portions, said first stopper selectively closing downwstream ends of said grooves of said first aligning portion for selectively preventing said chip parts transferring from said first aligning portion to said second aligning portion;

a separable portion having a plurality of receiving cavities aligned with downwstream ends of said downwardly sloped grooves of said second aligning portion, respectively, each of said receiving cavities receiving said plurality of chip parts being downwardly slid in each of said downwardly sloped grooves; and a discharge portion for discharging said plurality of chip parts receiving in said receiving cavities.

2. The chip part handling apparatus in accordance with claim 1, wherein each of said plurality of chip parts having a rectangular parallelepiped shape.

3. The chip part handling apparatus in accordance with claim 1, wherein said discharge portion comprises a suction chuck for holding said chip parts by a vacuum.

4. The chip part handling apparatus in accordance with claim 1, further comprising means for vibrating said chip box and said aligning portion.

5. The chip part handling apparatus in accordance with claim 1, further comprising a second stopper for selectively closing downwstream ends of said grooves of said second aligning portion.

6. The chip part handling apparatus in accordance with claim 5, further comprising means for rotating said separable portion toward and away from said aligning portion so that said receiving cavities receive said plurality of chip parts from said downwardly sloped grooves of said second aligning portion when said separable portion approaches said aligning portion, said second stopper closing said downstream ends of said grooves of said second aligning portion after said cavities have received said chip parts, and said discharge portion discharges said chip parts from said receiving cavities when the former is separated from the latter.

7. The chip part handling apparatus in accordance with claim 5, wherein said first and second stoppers each comprise a plurality of pins removably arranged in said grooves of said first and second aligning portions, respectively.

8. The chip part handling apparatus in accordance with claim 1, further comprising means for changing inclination angles of said first aligning portion and said chip box with respect to said second aligning portion.

9. The chip part handling apparatus in accordance with claim 8, further comprising means for vibrating said first aligning portion and said chip box.

10. The chip part handling apparatus in accordance with claim 8, further comprising a second stopper for selectively closing downstream ends of said grooves of said second aligning portion.

11. The chip part handling apparatus in accordance with claim 10, wherein said first and second stopper each comprise a plurality of pins removably arranged in said grooves of said first and second aligning portions, respectively.

12. A chip part handling apparatus for aligning a plurality of chip parts along a prescribed direction and for discharging the plurality of chip parts, said apparatus comprising:

a chip box for containing said plurality of chip parts randomly;

an aligning portion including a first aligning portion and a second aligning portion, said second aligning portion being separate from and removably positioned downstream of said first aligning portion, said first and second aligning portions having a plurality of parallel downwardly sloped grooves, said grooves of said first aligning portion communicating with said chip box, each of said downwardly sloped grooves having a cross-section enabling serial alignment of said plurlaity of said chip parts, as well as an inclination angle enabling downward sliding of said plurality of chip parts;

means for changing inclination angles of said first aligning portion and said chip box with respect to said second aligning portion;

a separable portion having a plurality of receiving cavities aligned with downstream ends of said downwardly sloped grooves of said second aligning portion, respectively, each of said receiving cavities receiving said plurality of chip parts being downwardly slid in each of said downwardly sloped grooves; and a discharge portion for discharging said plurality of chip parts received in said receiving cavities.

13. The chip part handling apparatus in accordance with claim 12, further comprising means for vibrating said first aligning portion and said chip box.

* * * * *